United States Patent
Zhao et al.

(10) Patent No.: US 12,255,590 B2
(45) Date of Patent: Mar. 18, 2025

(54) RADIO FREQUENCY POWER AMPLIFIER, CHIP, AND COMMUNICATION TERMINAL

(71) Applicant: VANCHIP (TIANJIN) TECHNOLOGY CO., LTD., Tianjin (CN)

(72) Inventors: Jinxin Zhao, Tianjin (CN); Yunfang Bai, Tianjin (CN)

(73) Assignee: VANCHIP (TIANJIN) TECHNOLOGY CO., LTD., Tianjin (CN)

(*) Notice: Subject to any disclaimer, the term of this patent is extended or adjusted under 35 U.S.C. 154(b) by 502 days.

(21) Appl. No.: 17/663,429

(22) Filed: May 14, 2022

(65) Prior Publication Data

US 2022/0278659 A1    Sep. 1, 2022

Related U.S. Application Data (63) Continuation of application No. PCT/CN2020/128471, filed on Nov. 12, 2020.

(30) Foreign Application Priority Data

Nov. 15, 2019   (CN) ......................... 201911121417.2

(51) Int. Cl.
  *H03G 3/30*    (2006.01)
  *H03F 1/56*    (2006.01)
  *H03F 3/195*   (2006.01)
  *H03F 3/24*    (2006.01)

(52) U.S. Cl.
  CPC ............. *H03F 3/245* (2013.01); *H03F 1/565* (2013.01); *H03F 3/195* (2013.01); *H03F 2200/102* (2013.01); *H03F 2200/451* (2013.01)

(58) Field of Classification Search
  CPC ....................................................... H03G 3/30
  USPC ................................................. 330/279, 302
  See application file for complete search history.

(56) References Cited

U.S. PATENT DOCUMENTS

| | | | | |
|---|---|---|---|---|
| 5,606,285 A | * | 2/1997 | Wang | H03G 3/3042 330/134 |
| 5,640,691 A | * | 6/1997 | Davis | H03G 3/3047 455/127.2 |
| 6,982,594 B2 | * | 1/2006 | Snider | H03G 3/3047 330/129 |
| 7,148,749 B2 | * | 12/2006 | Rahman | H03G 3/3047 330/291 |

(Continued)

*Primary Examiner* — Henry Choe
(74) *Attorney, Agent, or Firm* — George Guosheng Wang; Upstream Research and Patent LLC (57) ABSTRACT

A radio frequency power amplifier, a chip, and a communication terminal. The radio frequency power amplifier comprises a power amplifier circuit (5), an output matching circuit (2), a power detection circuit (3), and a bias comparison circuit (4). The output power on a main signal path is measured by the power detection circuit (3), and an equivalent voltage proportional to the output power is obtained and input to the bias comparison circuit (4); the equivalent voltage value is adjusted by means of the bias comparison circuit (4) and compared with a control voltage (1) to provide a bias voltage and/or collector voltage for the power amplifier circuit (5), thereby forming a closed-loop circuit, such that the radio frequency power amplifier can work in a stable state when gains and output power are in different power levels.

10 Claims, 5 Drawing Sheets

(56) References Cited

U.S. PATENT DOCUMENTS

| | | | | |
|---|---|---|---|---|
| 7,205,842 B2* | 4/2007 | Gustavsson | ......... | H04W 52/228 |
| | | | | 330/285 |
| 7,352,244 B2* | 4/2008 | Takahashi | ............ | H03G 3/3047 |
| | | | | 330/141 |
| 7,358,807 B2* | 4/2008 | Scuderi | ..................... | H03F 1/52 |
| | | | | 330/279 |
| 8,427,232 B2* | 4/2013 | Qiu | ......................... | H03G 3/20 |
| | | | | 330/133 |
| 8,461,928 B2* | 6/2013 | Yahav | .................... | H03G 3/007 |
| | | | | 330/297 |

* cited by examiner

RADIO FREQUENCY POWER AMPLIFIER, CHIP, AND COMMUNICATION TERMINAL

TECHNICAL FIELD

The present invention belongs to the technical field of radio frequency integrated circuits, relating to a radio frequency power amplifier, meanwhile, an integrated circuit chip including the radio frequency power amplifier, and a corresponding communication terminal.

RELATED ART

A radio frequency power amplifier is an indispensable key component in a wireless communication application, which is used to perform power amplification on a modulated radio frequency signal outputted by a transceiver, to meet the power requirement of the radio frequency signal required for wireless communication. Power control needs to be performed on the radio frequency power amplifier due to the performance requirement of wireless communication. In addition, the gain and output power of the radio frequency power amplifier also change due to process deviations.

In the related art, there are mainly two power control methods for a radio frequency power amplifier.

One method is a power control method based on closed-loop control. This power control method mainly achieves to control a final output power of the radio frequency power amplifier by controlling an input power of the radio frequency power amplifier. In addition, according to this power control method, the same bias voltage is used to generate an output power that meets requirements. As a result, when the output power required by the radio frequency power amplifier is small, the current of the radio frequency power amplifier has a margin, causing unnecessary waste.

The other method is a power control method based on open-loop control. This power control method mainly achieves to control a final output power of the radio frequency power amplifier through a control voltage. According to this power control method, the magnitude of the output power of the radio frequency power amplifier controlled by the control voltage cannot be acquired. As a result, the control voltage cannot precisely control a bias voltage of a radio frequency power amplifier circuit, and thus cannot accurately control the output power of the radio frequency power amplifier.

SUMMARY

A primary technical problem to be resolved in the present invention is to provide a radio frequency power amplifier.

Another technical problem to be resolved in the present invention is to provide an integrated circuit chip including the radio frequency power amplifier and a corresponding communication terminal.

To achieve the objectives, the present invention adopts the following technical solutions.

According to a first aspect of the embodiments of the present invention, a radio frequency power amplifier is provided, including a power amplifier circuit, an output matching circuit, a power detection circuit, and a bias comparison circuit. The power amplifier circuit is connected to the output matching circuit to form a main signal path of the radio frequency power amplifier, an input end of the power detection circuit is connected to a node on the main signal path, an output end of the power detection circuit is connected to an input end of the bias comparison circuit, and an output end of the bias comparison circuit is connected to a bias end and/or a collector end of the power amplifier circuit.

An output power on the main signal path is detected by the power detection circuit, and an equivalent voltage proportional to the output power is obtained. After the equivalent voltage is inputted to the bias comparison circuit, a value of the equivalent voltage is adjusted according to different bias states required by different bias ends of the power amplifier circuit, to obtain one or more branch equivalent voltages.

Each branch equivalent voltage is separately compared with a control voltage pre-inputted to the bias comparison circuit, and a bias voltage and/or a collector voltage are continuously provided to the power amplifier circuit, until the control voltage corresponds to an output power level of the radio frequency power amplifier, to control the output power of the radio frequency power amplifier to be stable at different power levels.

Preferably, the power detection circuit includes a coupler and an envelope detector, an input end of the coupler is connected to an output end of the power amplifier circuit through the output matching circuit, a straight-through output end of the coupler is connected to an output load, a coupling output end of the coupler is connected to an input end of the envelope detector, and an output end of the envelope detector is connected to the input end of the bias comparison circuit.

Preferably, the coupler is replaced with a capacitor.

Preferably, the envelope detector includes a first resistor, a second resistor, a third resistor, a first diode, a fourth resistor, and a first capacitor; and the first resistor and the second resistor are connected between a power supply and the ground, the third resistor is connected between a positive electrode of the first diode and a common node of the first resistor and the second resistor, and a negative electrode of the first diode is connected to the ground through a parallel network of the fourth resistor and the first capacitor.

Preferably, the bias comparison circuit includes N low-dropout linear regulator (s), N is a positive integer; and an input end of each low-dropout linear regulator is respectively connected to the control voltage and the power detection circuit, and an output end of each low-dropout linear regulator is connected to the bias end and/or the collector end of the power amplifier circuit.

Preferably, each low-dropout linear regulator includes a fifth resistor, a sixth resistor, an operational amplifier, a PMOS transistor, and a seventh resistor, the fifth resistor and the sixth resistor are connected between a third node and the ground, a non-inverting input end of the operational amplifier is connected to a common node between the fifth resistor and the sixth resistor, an inverting input end of the operational amplifier is connected to an external baseband circuit, an output end of the operational amplifier is connected to a gate of the PMOS transistor, a source of the PMOS transistor is connected to a power supply, and a drain of the PMOS transistor is connected to the ground through the seventh resistor.

Preferably, the power amplifier circuit includes one or more stages of amplifier circuits and a bias circuit corresponding to each stage of amplifier circuit, and each stage of amplifier circuit is connected to the corresponding bias circuit.

Preferably, a node on the main signal path includes any stage of amplifier circuit of the power amplifier circuit, a first node, and a second node.

According to a second aspect of the embodiments of the present invention, an integrated circuit chip is provided, including the foregoing radio frequency power amplifier.

According to a third aspect of the embodiments of the present invention, a communication terminal is provided, including the foregoing radio frequency power amplifier.

According to the radio frequency power amplifier provided in the embodiments of the present invention, the output power on the main signal path is detected by the power detection circuit, the equivalent voltage proportional to the output power is obtained and inputted to the bias comparison circuit, and the value of the equivalent voltage is adjusted by the bias comparison circuit and compared with the control voltage, to provide the bias voltage and/or the collector voltage for the power amplifier circuit, thereby forming a closed-loop circuit. In this way, the radio frequency power amplifier can maintain a stable gain and output power when working at different power levels.

DETAILED DESCRIPTION

The technical content of the present invention is further described in detail below with reference to the accompanying drawings and specific embodiments.

Figure 1:
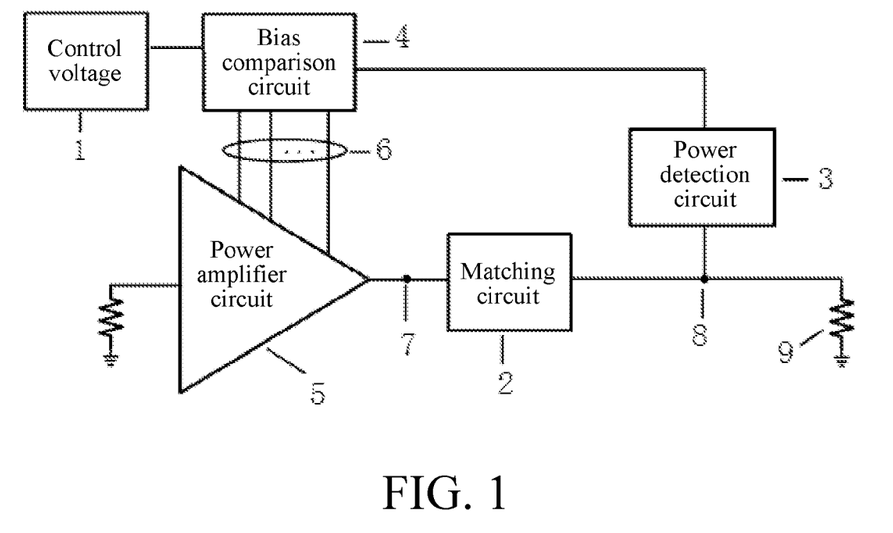
FIG. 1 is a circuit block diagram of a radio frequency power amplifier according to an embodiment of the present invention.

As shown in FIG. 1, a radio frequency power amplifier provided in an embodiment of the present invention includes a power amplifier circuit 5, an output matching circuit 2, a power detection circuit 3, and a bias comparison circuit 4. The power amplifier circuit 5, the output matching circuit 2, and an output load 9 are sequentially connected to form a main signal path of the radio frequency power amplifier, achieving the amplification of an input radio frequency signal to meet a power required for communication with a base station. An input end of the power detection circuit 3 is connected to a node (for example, a first node 7 between the power amplifier circuit 5 and the output matching circuit 2 or a second node 8 between the output matching circuit 2 and the output load 9 shown in FIG. 1) on the main signal path, an output end of the power detection circuit 3 is connected to an input end of the bias comparison circuit 4, and an output end of the bias comparison circuit 4 is connected to a bias end and/or a collector end of the power amplifier circuit 5.

A power on the main signal path is detected by the power detection circuit 3, and an equivalent voltage proportional to the power on the main signal path is obtained. After the equivalent voltage is inputted to the bias comparison circuit 4, a value of the equivalent voltage is adjusted according to different bias states required by different bias ends of the power amplifier circuit 5, to obtain one or more branch equivalent voltages. Each branch equivalent voltage is separately compared with a control voltage 1 pre-inputted to the bias comparison circuit 4 by an external baseband circuit, and a bias voltage 6 and/or a collector voltage that vary inversely with a voltage difference between the control voltage and the branch equivalent voltage are continuously provided to the power amplifier circuit 5, until the generated bias voltage and/or collector voltage enable the corresponding branch equivalent voltage to be equal to the control voltage, and enable the control voltage to correspond to an output power level of the radio frequency power amplifier, to control the output power of the radio frequency power amplifier to be stable at different power levels.

It should be noted that, the control voltage pre-inputted to the bias comparison circuit 4 by the external baseband circuit corresponds to the output power level of the radio frequency power amplifier, that is, one output power level corresponds to one control voltage. A plurality of control voltages corresponding to the output power level of the radio frequency power amplifier are preset in the baseband circuit. A value of the control voltage provided by the baseband circuit for the radio frequency power amplifier is determined according to an output power actually required when a communication terminal (for example, a mobile phone) exchanges information with the base station. That is, different control voltages are set, so that the radio frequency power amplifier can obtain different output powers. For example, it is assumed that the mobile phone communicates with the base station. In this case, if the mobile phone is close to the base station, the output power required for the mobile phone to exchange information with the base station is relatively small. The base station feeds back the output power required for the exchange of information with the mobile phone to the mobile phone. The mobile phone then provides a control voltage corresponding to a required output power level to the radio frequency power amplifier through the baseband circuit.

Figure 2:
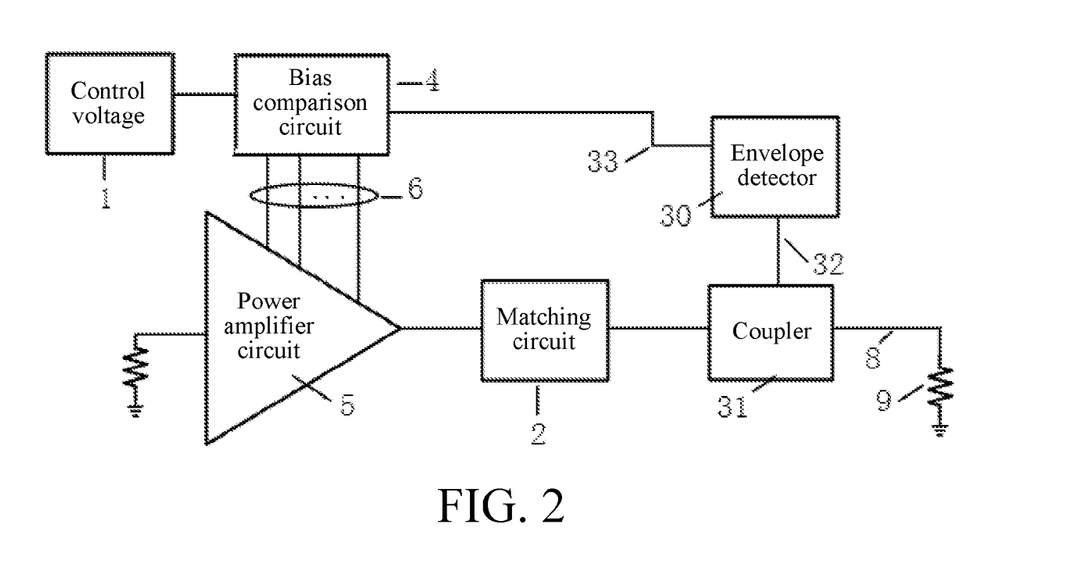
FIG. 2 is a circuit block diagram of a radio frequency power amplifier using a power detection circuit formed by an envelope detector and a coupler according to an embodiment of the present invention.

As shown in FIG. 2, in an embodiment of the present invention, the power detection circuit 3 includes a coupler 31 and an envelope detector 30. An input end of the coupler 31 is connected to an output end of the power amplifier circuit 5 through the output matching circuit 2, a straight-through output end 8 of the coupler 31 is connected to an output load 9, a coupling output end 32 of the coupler 31 is connected to an input end of the envelope detector 30, and an output end of the envelope detector 30 is connected to the input end of the bias comparison circuit 4.

The coupler 31 is configured to detect an output power at a position on the main signal path of the radio frequency power amplifier formed by the power amplifier circuit 5, the output matching circuit 2, and the output load 9, and generate a coupling power. The coupling power has a proportional relationship with the output power of the radio frequency power amplifier. For example, an output power at a position on the main signal path of the radio frequency power amplifier detected by the coupler 31 is one percent of the output power of the radio frequency power amplifier.

Connecting the coupler 31 to the second node 8 on the main signal path has less impact on the output power of the power amplifier circuit 5 than connecting to the first node 7, and a power detected by the coupler 31 at the second node 8 is closer to a final output power. Therefore, it is preferable to connect the coupler 31 to the second node 8 on the main signal path, which not only ensures little impact on a radio frequency signal of the main signal path, but also makes the power detected by the power detection circuit 3 closer to the final output power of the amplifier circuit. A coupling coefficient of the coupler 31 is generally greater than 20 dB, so that the loss of the output power of the power amplifier circuit 5 can be reduced while an output power at a position on the main signal path is detected.

In addition, the coupler may be replaced with a capacitor, to detect an output power at a position on the main signal path of the radio frequency power amplifier.

Figure 3:
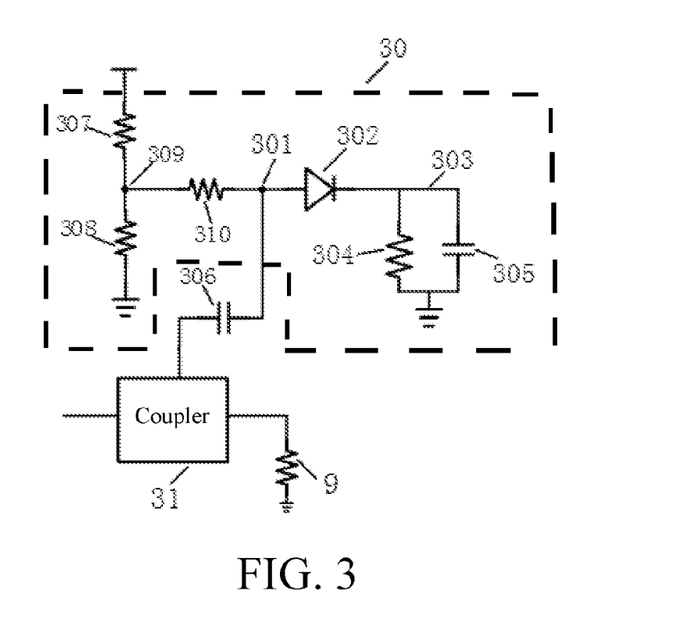
FIG. 3 is a circuit principle diagram of an envelope detector in a radio frequency power amplifier according to an embodiment of the present invention.
Figure 4:
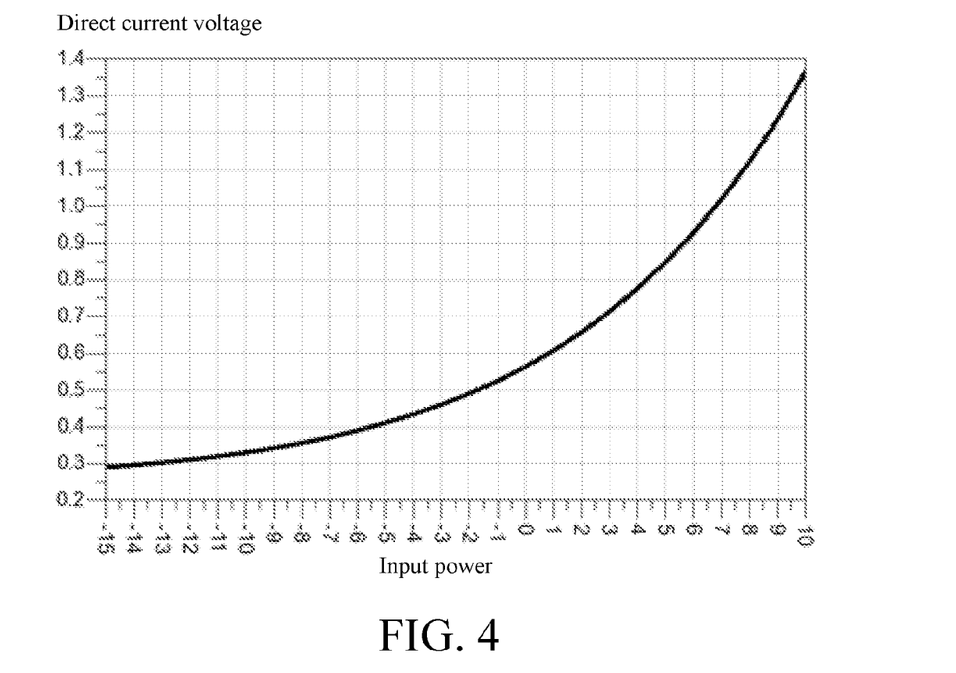
FIG. 4 is a diagram of a relationship between an input power and an output direct current voltage of an envelope detector in a radio frequency power amplifier according to an embodiment of the present invention.

The envelope detector 30 is configured to receive a coupling power outputted by the coupling output end 32 of the coupler 31 and obtain an equivalent voltage 33 proportional to the coupling power. As shown in FIG. 3, the envelope detector 30 includes the first resistor 307, the second resistor 308, the third resistor 310, the first diode 302, the fourth resistor 304, and the first capacitor 305. The first resistor 307 and the second resistor 308 are connected between a power supply and the ground, and provide a bias voltage for the first diode 302 through the voltage dividing action. The third resistor 310 is connected between a positive electrode 301 of the first diode 302 and a common node 309 of the first resistor 307 and the second resistor 308, to provide a suitable bias current for the first diode 302. A negative electrode 303 of the first diode 302 is connected to the ground through a parallel network of the fourth resistor 304 and the first capacitor 305. The fourth resistor 304 is used as a load of the first diode 302, provides the first diode 302 with a direct current state, and provides the first diode 302 with a power-to-voltage conversion gain. The first capacitor 305 is used as a filter capacitor of the first diode 302 and is configured to obtain a direct current part of an output voltage of the first diode 302. Through the fourth resistor 304 and the first capacitor 305, the coupling power outputted by the coupler 31 can be converted into an equivalent voltage with a preset swing, where the equivalent voltage is proportional to the coupling power. The coupling power outputted by the coupler 31 is inputted to the positive electrode 301 of the first diode 302 through the capacitor 306. After the envelope detector 30 converts the coupling power outputted by the coupler 31 into the equivalent voltage with the preset swing, the equivalent voltage is inputted to the bias comparison circuit 4 through a common node 303 between the fourth resistor 304 and the first capacitor 305 which is used as the output end of the envelope detector 30. As shown in FIG. 4, when an input power (the coupling power outputted by the coupler 31) at the positive electrode 301 of the first diode 302 changes from −15 dBm to 10 dBm, a direct current voltage (the equivalent voltage with the preset swing corresponding to the coupling power) at the negative electrode 303 of the first diode 302 changes from 0.3 V to 1.35 V.

Figure 5:
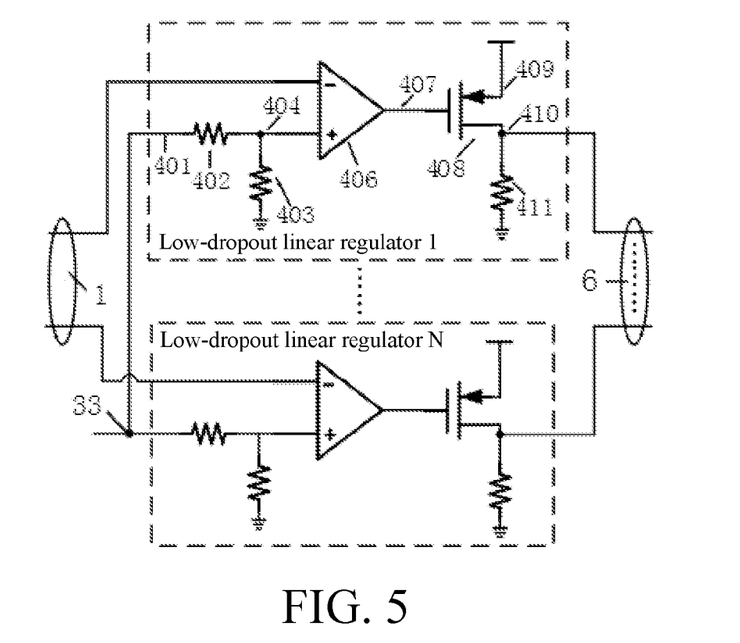
FIG. 5 is a circuit principle diagram of a bias comparison circuit in a radio frequency power amplifier according to an embodiment of the present invention.

As shown in FIG. 5, in an embodiment of the present invention, the bias comparison circuit 4 includes N low-dropout linear regulator (s), where N is a positive integer, and a value of N is determined by a quantity of bias voltages and collector voltages actually required by the power amplifier circuit 5. Each low-dropout linear regulator includes the fifth resistor 402, the sixth resistor 403, the operational amplifier 406, the PMOS transistor 408, and the seventh resistor 411. Connection relationships and working principles of the components of each low-dropout linear regulator are as follows: The fifth resistor 402 and the sixth resistor 403 are connected between the third node 401 and the ground, and are configured to replicate the equivalent voltage outputted by the power detection circuit 3 in a specific proportion through the voltage dividing action of the fifth resistor 402 and the sixth resistor 403 according to a working status of the power amplifier circuit 5, to obtain a branch equivalent voltage. A non-inverting input end of the operational amplifier 406 is connected to a common node 404 between the fifth resistor 402 and the sixth resistor 403, and is configured to receive, through the common node 404, the branch equivalent voltage obtained through the voltage dividing action of the fifth resistor 402 and the sixth resistor 403. An inverting input end of the operational amplifier 406 is connected to an external baseband circuit, and is configured to receive a control voltage corresponding to an output power level actually required by the radio frequency power amplifier. An output end of the operational amplifier 406 is connected to a gate of the PMOS transistor 408, a source 409 of the PMOS transistor 408 is connected to a power supply, and a drain 410 of the PMOS transistor 408 is connected to the ground through the seventh resistor 411.

The working principle of the bias comparison circuit 4 is as follows: The equivalent voltage 33 outputted by the power detection circuit 3 and proportional to the output power detected is inputted to the operational amplifier 406 of each low-dropout linear regulator. Each low-dropout linear regulator replicates the equivalent voltage outputted by the power detection circuit 3 in a specific proportion through the voltage dividing action of the fifth resistor 402 and the sixth resistor 403 according to the working status of the power amplifier circuit 5, to obtain a branch equivalent voltage. After the operational amplifier 406 compares the branch equivalent voltage with the control voltage 1 pre-inputted to the inverting input end of the operational amplifier 406, the drain 410 of the PMOS transistor 408 generates a voltage through the seventh resistor 411 to provide a bias voltage and/or a collector voltage for the power amplifier circuit 5. The value of the seventh resistor 411 may be selected from different values as required.

The power amplifier circuit 5 includes one or more stages of amplifier circuits and a bias circuit corresponding to each stage of amplifier circuit. Therefore, each low-dropout linear regulator according to the working status of the power amplifier circuit 5 may refer to a working status of a specific stage of amplifier circuit of the power amplifier circuit 5. Each low-dropout linear regulator replicates the equivalent voltage outputted by the power detection circuit 3 in a specific proportion through the voltage dividing action of the fifth resistor 402 and the sixth resistor 403 according to a working status of a specific stage of amplifier circuit of the power amplifier circuit 5, to obtain a branch equivalent voltage. That is, each low-dropout linear regulator may provide a bias voltage and/or a collector voltage for a corresponding stage of amplifier circuit in the power amplifier circuit 5, and control an output power of the corresponding stage of amplifier circuit through the bias voltage or the collector voltage. Therefore, a plurality of low-dropout linear regulators may be used to provide bias voltages and/or collector voltages for a plurality of corresponding amplifier circuits in the power amplifier circuit 5.

Each low-dropout linear regulator forms closed-loop control with the power amplifier circuit 5, the output matching circuit 2, and the power detection circuit 3 respectively. Therefore, each low-dropout linear regulator continuously receives equivalent voltages outputted by the power detection circuit 3. The low-dropout linear regulator dynamically adjusts an equivalent voltage received each time to obtain a branch equivalent voltage, and compares the branch equivalent voltage with the control voltage to provide a bias voltage and/or a collector voltage for a corresponding stage of amplifier circuit in the power amplifier circuit 5, until a branch equivalent voltage corresponding to each low-dropout linear regulator is equal to the control voltage, so that the control voltage corresponds to an output power level of the radio frequency power amplifier, to control the output power of the radio frequency power amplifier to be stable at different power levels.

The output matching circuit 2 is configured to implement impedance matching with an external antenna, so that the power amplifier circuit 5 can input a radio frequency signal to the antenna, and transmit the radio frequency signal to the base station through the antenna. The output matching circuit 2 includes an inductor connected in series and a capacitor connected in parallel, that is, the inductor is connected before the first node 7 and the second node 8, and the capacitor is connected between the second node 8 and the ground.

In an example where the power amplifier circuit 5 adopts two stages of amplifier circuits and bias circuits corresponding to the two stages of amplifier circuits, and in a typical case that an output power of the second node 8 is detected to provide a collector voltage for a specific stage of amplifier circuit of the power amplifier circuit 5 or provide a bias voltage and a collector voltage for each stage of amplifier circuit, the working principle of the radio frequency power amplifier provided in the embodiments of the present invention and the structures of each stage of amplifier circuit and the corresponding bias circuits are described.

Figure 6:
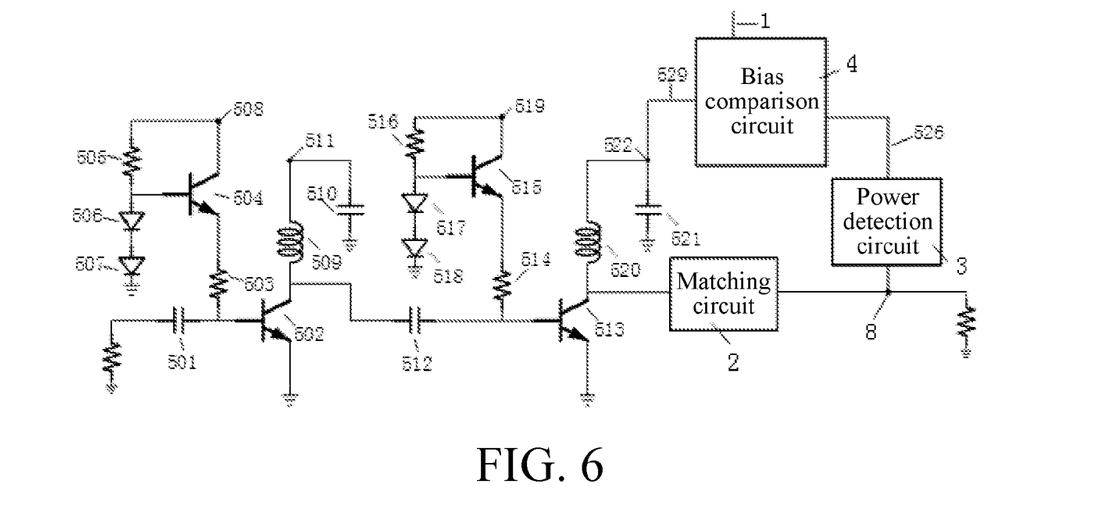
FIG. 6 is a circuit principle diagram 1 of a radio frequency power amplifier using two stages of amplifier circuit.

As shown in FIG. 6, the first stage of amplifier circuit of the power amplifier circuit 5 includes the first triode 502, and the collector of the first triode 502 is connected to one end of a first inductor 509. The first inductor 509 is used as a load of the first stage of amplifier circuit. The other end of the first inductor 509 is connected to the ground through a second capacitor 510. The second capacitor 510 is used as a bypass capacitor of the first stage amplifier circuit, so that a common end 511 of the first inductor 509 and the second capacitor 510 may be considered as an alternating current ground. One end of an eighth resistor 505 and a collector of a second triode 504 are connected to a node 508, the other end of the eighth resistor 505 is connected to a base of the second triode 504, and the other end of the eighth resistor 505 is also connected to the ground through the second diode 506 and the third diode 507. An emitter of the second triode 504 is connected to a base of the first triode 502 through a ninth resistor 503, to provide a bias current for the first triode 502. The eighth resistor 505, the second triode 504, the second diode 506, the third diode 507, and the ninth resistor 503 form a bias circuit corresponding to the first stage of amplifier circuit. The collector of the first triode 502 is connected to a base of a third triode 513 through a third capacitor 512. The first stage of amplifier circuit receives a radio frequency signal through a capacitor 501, and inputs the radio frequency signal to a second stage of amplifier circuit through the third capacitor 512. Similarly, one end of a second inductor 520 is connected to a collector of the third triode 513 as a load of the third triode 513. The other end of the second inductor 520 is connected to the ground through a fourth capacitor 521. The fourth capacitor 521 is used as a bypass capacitor of the second stage of amplifier circuit, so that a common end 522 of the second inductor 520 and the fourth capacitor 521 may be considered as an alternating current ground. One end of a tenth resistor 516 and a collector of a fourth triode 515 are connected to a node 519. The other end of the tenth resistor 516 is connected to a base of the fourth triode 515, and is connected to the ground through a fourth diode 517 and a fifth diode 518. An emitter of the fourth triode 515 is connected to the base of the third triode 513 through an eleventh resistor 514, to provide a bias current for the third triode 513. The collector of the third triode 513 is outputted to an output load through the output matching circuit 2.

The power detection circuit 3 detects the output power of the second node 8, and obtains an equivalent voltage 526 proportional to the output power. The equivalent voltage 526 is inputted to the bias comparison circuit 4. The bias comparison circuit 4 obtains a bias voltage 529 by comparing the equivalent voltage 526 with the control voltage 1 pre-inputted to the bias comparison circuit 4. The bias voltage 529 is connected to a common node 522 between the second inductor 520 and the fourth capacitor 521 to provide a collector voltage for the second stage of amplifier circuit. The output power of the power amplifier circuit is controlled by the collector voltage.

Figure 7:
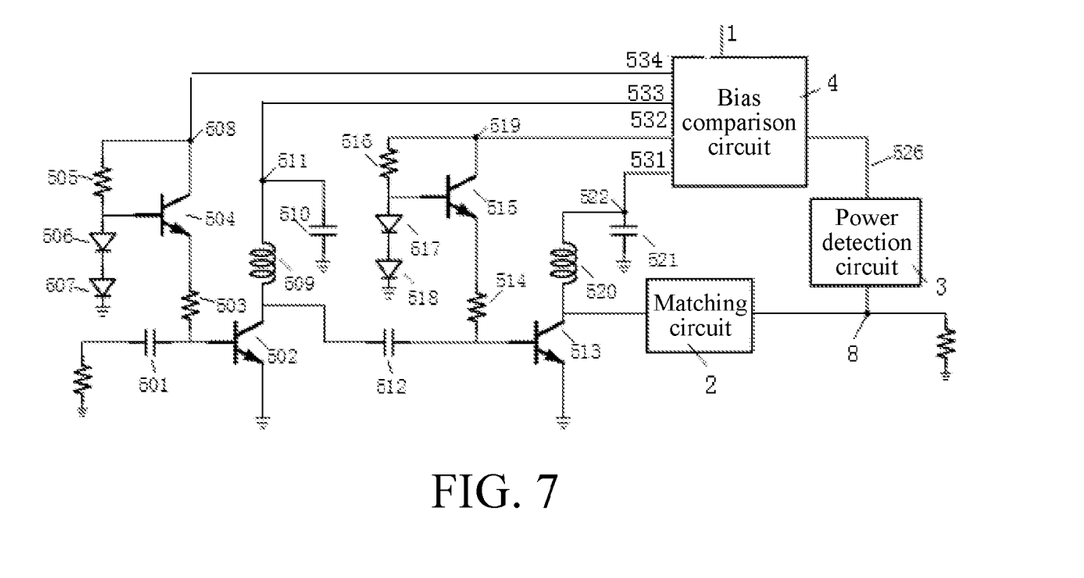
FIG. 7 is a circuit principle diagram 2 of a radio frequency power amplifier using two stages of amplifier circuit.

As shown in FIG. 7, the output power of the second node 8 is detected by the power detection circuit 3, and the equivalent voltage 526 proportional to the output power is obtained. The equivalent voltage 526 is respectively inputted to four low-dropout linear regulators of the bias comparison circuit 4. Two of the low-dropout linear regulators adjust a value of the equivalent voltage according to a working status of the first stage of amplifier circuit of the power amplifier circuit 5, to obtain two branch equivalent voltages. The two low-dropout linear regulators respectively compare the corresponding branch equivalent voltages with the control voltage, and continuously generate a corresponding bias voltage 534 and a corresponding collector voltage 533 for the first stage of amplifier circuit through the node 508 and a node 511, until the generated bias voltage and collector voltage enable the corresponding branch equivalent voltages to be equal to the control voltage. The other two of the low-dropout linear regulators adjust the value of the equivalent voltage according to a working status of the second stage of amplifier circuit of the power amplifier circuit 5, to obtain two branch equivalent voltages as well. The two low-dropout linear regulators separately compare the corresponding branch equivalent voltages with the control voltage, and continuously generate a corresponding bias voltage 532 and a corresponding collector voltage 531 for the second stage of amplifier circuit through the node 519 and a node 522, until the generated bias voltage and collector voltage enable the corresponding branch equivalent voltages to be equal to the control voltage.

Figure 8:
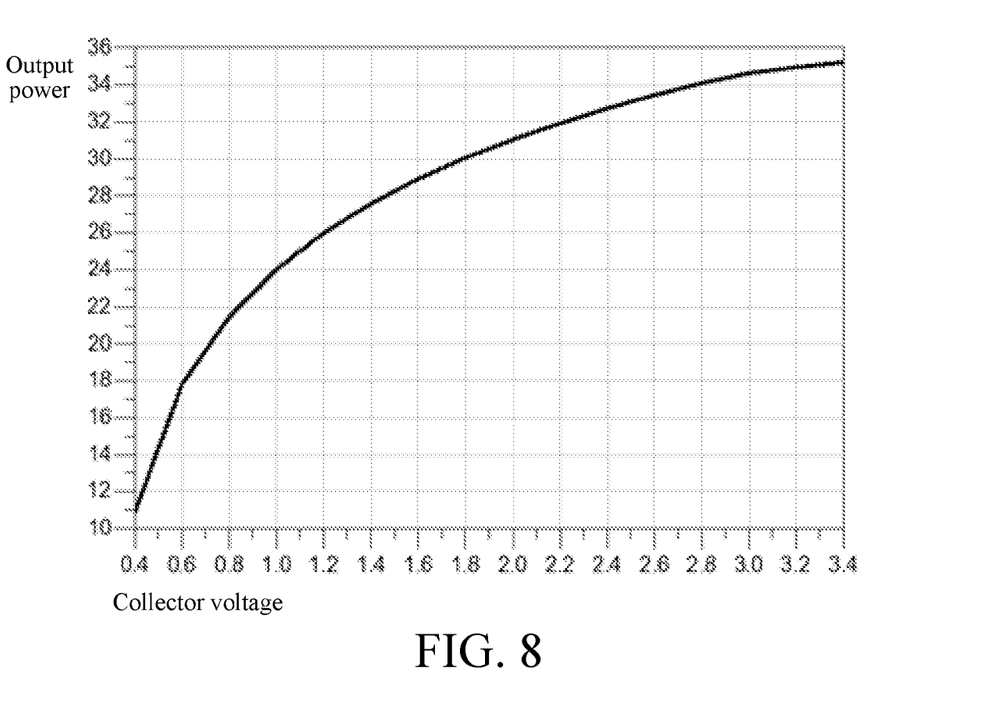
FIG. 8 is a diagram of a relationship between a collector voltage and an output power of a power amplifier circuit in a radio frequency power amplifier according to an embodiment of the present invention.

As shown in FIG. 8, when the collector voltage provided by the bias comparison circuit 4 for the second stage of amplifier circuit changes from 0.4 V to 3.4 V, the output power of the power amplifier circuit changes from 11 dBm to 35 dBm. Therefore, as can be seen from FIG. 4 and FIG. 8, different control voltages are set, so that the power amplifier circuit can obtain different output powers.

According to the radio frequency power amplifier provided in the embodiments of the present invention, the output power on the main signal path is detected by the power detection circuit, the equivalent voltage proportional to the output power is obtained and inputted to the bias comparison circuit, and the value of the equivalent voltage is adjusted by the bias comparison circuit and compared with the control voltage, to provide the bias voltage and/or the collector voltage for the power amplifier circuit, thereby forming a closed-loop circuit to stably control the output power of the power amplifier circuit In addition, the output power on the main signal path is detected, and the working status of each stage of amplifier circuit is adjusted, thereby suppressing a change of the working status of the radio frequency power amplifier caused by a process change, and reducing the impact of a change of the input power on the working status of the radio frequency power amplifier. In this way, the radio frequency power amplifier can maintain a stable gain and output power when working at different power levels.

The radio frequency power amplifier provided in the embodiments of the present invention may alternatively be applied to an integrated circuit chip. The specific structure of the radio frequency power amplifier in the integrated circuit chip is not described in detail herein.

Figure 9:
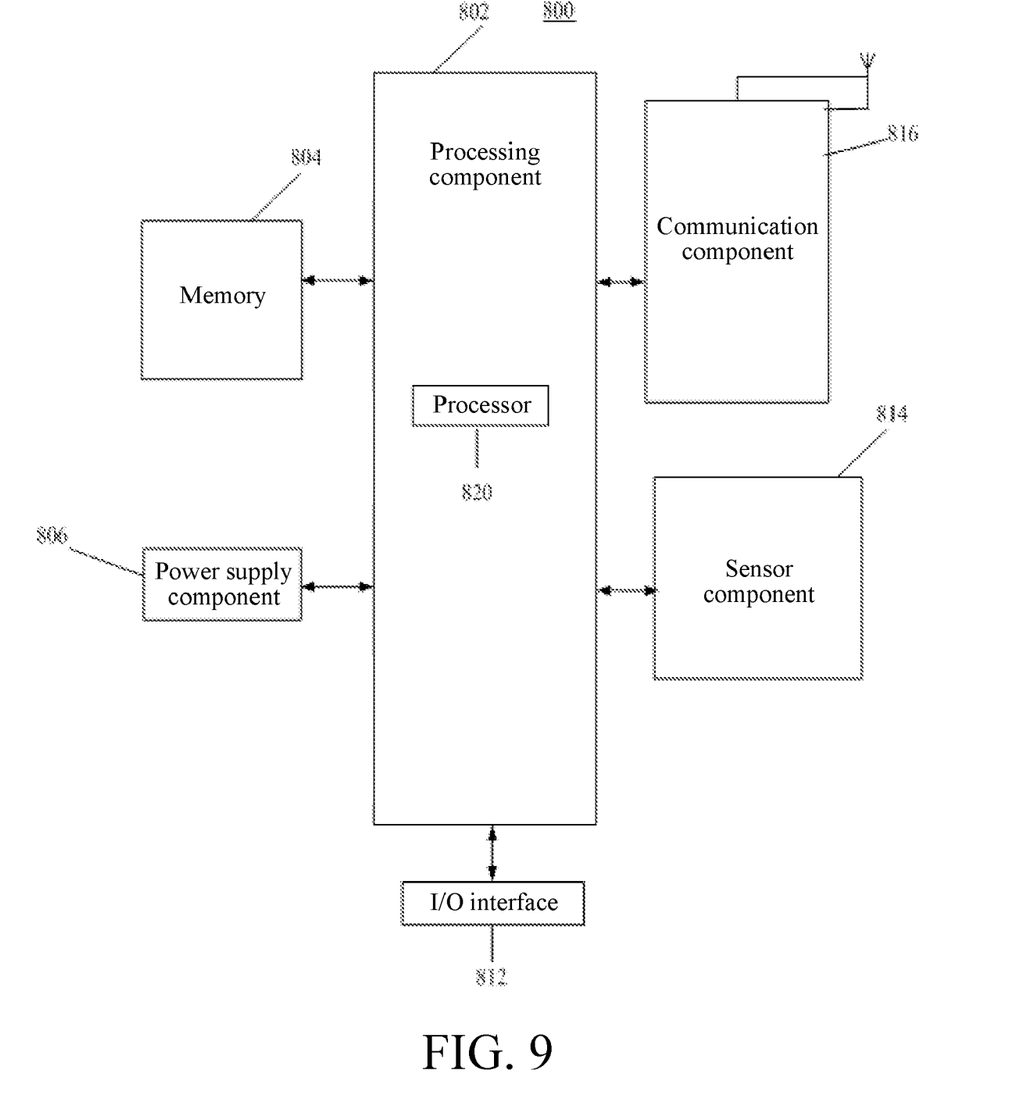
FIG. 9 is a structural block diagram of a communication terminal according to an embodiment of the present invention.

In addition, the radio frequency power amplifier may alternatively be applied to a communication terminal shown in FIG. 9 as an important part of a communication component. The communication terminal described herein is a computer device that may be used in a mobile environment and that supports various communication standards such as GSM, EDGE, Wi-Fi, and 4G/5G. The computer device includes a mobile phone, a notebook computer, a tablet computer, an in-vehicle computer, or the like. In addition, the technical solution provided in the embodiments of the present invention is also applicable to application scenarios of other communication components, for example, a communication base station.

FIG. 9 is a structural block diagram of a communication terminal according to an embodiment of the present invention. Referring to FIG. 9, a communication terminal 800 may include one or more of the following components: a processing component 802, a memory 804, a power supply component 806, an input/output (I/O) interface 812, a sensor component 814, and a communication component 816.

The processing component 802 generally controls an overall operation of the communication terminal 800. The processing component 802 may include one or more processors 820 to execute instructions, to complete all or some steps of the foregoing method. In addition, the processing component 802 may include one or more modules, to facilitate the interaction between the processing component 802 and other components.

The memory 804 is configured to store various types of data to support operations on the communication terminal 800. Examples of the data include instructions of any application or method to be operated on the communication terminal 800. The memory 804 can be implemented by any type of volatile or non-volatile storage devices or a combination thereof, such as a static random-access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic disk, or an optical disc.

The power supply component 806 provides power to various components of the communication terminal 800. The power supply component 806 may include a power supply management system, one or more power supplies, and other components associated with generating, managing, and allocating power for the communication terminal 800. The I/O interface 812 provides an interface between the processing component 802 and an external interface module. The external interface module may be a keyboard, a scroll wheel, a button, or the like.

The sensor component 814 includes one or more sensors, configured to provide status evaluation in each aspect to the communication terminal 800. In some embodiments, the sensor component 814 may include an acceleration sensor, a gyroscope sensor, a magnetic sensor, a pressure sensor, a temperature sensor, or the like.

The communication component 816 is configured to facilitate communication in a wired or wireless manner between the communication terminal 800 and other devices. The other devices are preferably 4G/5G access modules. The communication terminal 800 may access wireless networks based on various communication standards such as GSM, EDGE, Wi-Fi, 4G/5G, or a combination thereof.

The radio frequency power amplifier, the chip, and the communication terminal provided in the embodiments of the present invention are described above in detail. For a person of ordinary skill in the art, any obvious change made to the present invention without departing from the essential content of the present invention shall fall within the protection scope of the patent of the present invention.

What is claimed is:

1. A radio frequency power amplifier, comprising a power amplifier circuit, an output matching circuit, a power detection circuit, and a bias comparison circuit, wherein the power amplifier circuit is connected to the output matching circuit, an input end of the power detection circuit is connected to a node on a main signal path, an output end of the power detection circuit is connected to an input end of the bias comparison circuit, and an output end of the bias comparison circuit is connected to a bias end and/or a collector end of the power amplifier circuit;

an output power on the main signal path is detected by the power detection circuit, and an equivalent voltage proportional to the output power is obtained; and after the equivalent voltage is inputted to the bias comparison circuit, a value of the equivalent voltage is adjusted according to different bias states required by different bias ends of the power amplifier circuit, to obtain one or more branch equivalent voltages; and each branch equivalent voltage is separately compared with a control voltage pre-inputted to the bias comparison circuit, and a bias voltage and/or a collector voltage are continuously provided to the power amplifier circuit, until the control voltage corresponds to an output power level of the radio frequency power amplifier.

2. The radio frequency power amplifier according to claim 1, wherein
the power detection circuit comprises a coupler and an envelope detector, an input end of the coupler is connected to an output end of the power amplifier circuit through the output matching circuit, a straight-through output end of the coupler is connected to an output load, a coupling output end of the coupler is connected to an input end of the envelope detector, and an output end of the envelope detector is connected to the input end of the bias comparison circuit.

3. The radio frequency power amplifier according to claim 2, wherein
the coupler is replaced with a capacitor.

4. The radio frequency power amplifier according to claim 2, wherein
the envelope detector comprises a first resistor, a second resistor, a third resistor, a first diode, a fourth resistor, and a first capacitor; and the first resistor and the second resistor are connected between a power supply and the ground, the third resistor is connected between a positive electrode of the first diode and a common node of the first resistor and the second resistor, and a negative electrode of the first diode is connected to the ground through a parallel network of the fourth resistor and the first capacitor.

5. The radio frequency power amplifier according to claim 1, wherein
the bias comparison circuit comprises N low-dropout linear regulator(s), N is a positive integer; and an input end of each low-dropout linear regulator is respectively connected to the control voltage and the power detection circuit, and an output end of each low-dropout linear regulator is connected to the bias end and/or the collector end of the power amplifier circuit.

6. The radio frequency power amplifier according to claim 1, wherein
each low-dropout linear regulator comprises a fifth resistor, a sixth resistor, an operational amplifier, a PMOS transistor, and a seventh resistor, the fifth resistor and the sixth resistor are connected between a third node and the ground, a non-inverting input end of the operational amplifier is connected to a common node between the fifth resistor and the sixth resistor, an inverting input end of the operational amplifier is connected to an external baseband circuit, an output end of the operational amplifier is connected to a gate of the PMOS transistor, a source of the PMOS transistor is connected to a power supply, and a drain of the PMOS transistor is connected to the ground through the seventh resistor.

7. The radio frequency power amplifier according to claim 1, wherein
the power amplifier circuit comprises one or more stages of amplifier circuits and a bias circuit corresponding to each stage of amplifier circuit, and each stage of amplifier circuit is connected to the corresponding bias circuit.

8. The radio frequency power amplifier according to claim 7, wherein
a node on the main signal path comprises any stage of amplifier circuit of the power amplifier circuit, a first node, and a second node.

9. An integrated circuit chip, comprising the radio frequency power amplifier according to claim 1.

10. A communication terminal, comprising the radio frequency power amplifier according to claim 1.

* * * * *